US010978584B2

United States Patent
Du et al.

(10) Patent No.: US 10,978,584 B2
(45) Date of Patent: Apr. 13, 2021

(54) SEMICONDUCTOR STRUCTURE, SEMICONDUCTOR ASSEMBLY AND POWER SEMICONDUCTOR DEVICE

(71) Applicants: UNIVERSITY OF ELECTRONIC SCIENCE AND TECHNOLOGY OF CHINA, Sichuan (CN); CHONGQING PINGWEI ENTERPRISE CO., LTD., Chongqing (CN)

(72) Inventors: Jiangfeng Du, Sichuan (CN); Zhenchao Li, Sichuan (CN); Dong Liu, Sichuan (CN); Zhiyuan Bai, Sichuan (CN); Qi Yu, Sichuan (CN); Shuzhou Li, Sichuan (CN)

(73) Assignees: UNIVERSITY OF ELECTRONIC SCIENCE AND TECHNOLOGY, Sichuan (CN); CHONGQING PINGWEI ENTERPRISE CO., LTD., Chongqing (CN)

( * ) Notice: Subject to any disclaimer, the term of this patent is extended or adjusted under 35 U.S.C. 154(b) by 155 days.

(21) Appl. No.: 15/737,523

(22) PCT Filed: Aug. 17, 2016

(86) PCT No.: PCT/CN2016/095675
§ 371 (c)(1),
(2) Date: Jun. 12, 2019

(87) PCT Pub. No.: WO2018/000551
PCT Pub. Date: Jan. 4, 2018

(65) Prior Publication Data
US 2019/0305080 A1    Oct. 3, 2019

(30) Foreign Application Priority Data

Jul. 1, 2016 (CN) .......................... 201610522196.X

(51) Int. Cl.
*H01L 29/78* (2006.01)
*H01L 29/861* (2006.01)
(Continued)

(52) U.S. Cl.
CPC ...... *H01L 29/7802* (2013.01); *H01L 23/3185* (2013.01); *H01L 23/3192* (2013.01);
(Continued)

(58) Field of Classification Search
CPC .......... H01L 29/66136; H01L 29/8611; H01L 29/8613; H01L 2924/12036;
(Continued)

(56) References Cited

U.S. PATENT DOCUMENTS 4,484,214 A * 11/1984 Misawa ................ H01L 23/291
257/147
2013/0240874 A1 * 9/2013 Maekawa ......... H01L 29/66136
257/43
(Continued)

FOREIGN PATENT DOCUMENTS

WO    WO-2016075787 A1 * 5/2016 ....... H01L 21/02161

*Primary Examiner* — Joseph C. Nicely
(74) *Attorney, Agent, or Firm* — Global IP Services; Tianhua Gu

(57) ABSTRACT

A semiconductor structure, a semiconductor assembly and a power semiconductor device. The semiconductor structure includes: a P-type semiconductor material layer; an N-type semiconductor material layer adjacent to the P-type semiconductor material layer, wherein the N-type semiconductor material layer and the P-type semiconductor material layer together from a PN junction; and a plurality of insulating material layers located outside the PN junction and distributed along the superposition direction of the P-type semiconductor material layer and the N-type semiconductor material layer, wherein the relative dielectric constants of the adjacent insulating material layers are different. The
(Continued)

semiconductor structure in the present invention significantly optimizes the distribution of an electric field during the off-state high voltage operation of a device, greatly improves the breakdown voltage of the device, avoids the premature breakdown of the device caused by the concentration effect of the electric field at the edge of the junction.

16 Claims, 9 Drawing Sheets

(51) Int. Cl.
*H01L 29/06* (2006.01)
*H01L 23/31* (2006.01)
*H01L 29/739* (2006.01)

(52) U.S. Cl.
CPC .......... *H01L 29/06* (2013.01); *H01L 29/0615* (2013.01); *H01L 29/7395* (2013.01); *H01L 29/861* (2013.01); *H01L 29/8611* (2013.01)

(58) Field of Classification Search
CPC ............. H01L 23/3192; H01L 23/3185; H01L 29/0615; H01L 29/7802; H01L 29/7395; H01L 29/861; H01L 29/1095; H01L 29/66333; H01L 29/6634; H01L 29/7371; H01L 27/0664
See application file for complete search history.

(56) References Cited

U.S. PATENT DOCUMENTS

2016/0072499 A1* 3/2016 Ichikawa .............. H02M 7/497
　　　　　　　　　　　　　　　　　327/432
2017/0317075 A1* 11/2017 Arai ........................ H01L 29/32

* cited by examiner

SEMICONDUCTOR STRUCTURE, SEMICONDUCTOR ASSEMBLY AND POWER SEMICONDUCTOR DEVICE

CROSS REFERENCES

This application claims the benefit of priority to Chinese Patent Application No. CN 201610522196X, entitled "semiconductor structure, semiconductor assembly and power semiconductor device", filed with the Chinese Patent Office on Jul. 1, 2016, and PCT application PCT/CN2016/095675, entitled "semiconductor structure, semiconductor assembly and power semiconductor device", filed with WIPO on Aug. 17, 2016, the contents of which are incorporated herein by reference in its entirety.

TECHNICAL FIELD

The present invention relates to the technical field of semiconductor, and in particular to a semiconductor structure, a semiconductor assembly and a power semiconductor device.

BACKGROUND

Power semiconductor diode is a key component in a circuit system, and is the foundation of a power semiconductor. The power semiconductor diode has a simple structure, good operation reliability, and is widely applied to civilian and military occasions. Especially, a wide bandgap semiconductor power diode is particularly applied in environments having high voltage, high power and high temperature due to its good properties such as wide bandgap, high critical electric field, high electron saturation velocity, good heat conduction performance, anti-irradiation capability and good chemical stability, which is one of the most potential power devices in power electronics applications.

FIG. 1 shows a structure diagram of a traditional diode in the prior art, which mainly includes: a P-type doped region 11, an N-type doped region 12, an anode 13 and a cathode 14. The P-type doped region 11 and the N-type doped region 12 form a PN junction. The anode 13 and the P-type doped region 11 form ohmic contact. The cathode 14 and the N-type doped region 12 form ohmic contact.

However, the above diode structure has the following problems: 1) the distribution curve of the electric field of the PN junction is triangular, the breakdown voltage is negatively relevant to the doping concentration at the low doped side and is limited to avalanche breakdown; the lower the doping concentration is, the longer the base of the triangle is; the smaller the height of the triangle is (i.e., the maximum electric field intensity), the less possible to reach the critical breakdown electric field Ec required by avalanche breakdown it is; By preferring to increase the length of the low doped region rather than change the doping concentration, the breakdown voltage will first increase and then be saturated, which limits further improvement of the breakdown voltage; 2) since the width of the barrier region will narrow where the radius of curvature is small, the electric field here will be more concentrated; therefore, under the same condition of the reverse biased voltage, the electric field intensity at the cylindrical junction of the planar PN junction interface will reach the critical electric field of avalanche breakdown earlier than the ideal one dimensional PN junction interface, such that breakdown occurs in the realistical planar PN junction earlier than in the ideal one dimensional PN junction, thereby lowering the avalanche breakdown voltage; and the breakdown voltage of the device is merely 80% of the ideal one dimensional PN junction.

In order to improve the breakdown voltage of the traditional diode and avoid pre-breakdown and reduction of long-term stability caused by the edge of the PN junction, the following technical means is usually applied to make improvements.

(1) Punch-Through Design

When a reverse bias voltage is externally applied to the PiN junction, all the electric field is loaded on the PN junction; with the continuous increasing of the reverse bias voltage, the electric field intensity will also increase and expand outwards in the lightly doped N-type region. If the concentration of the lightly doped N-type region is low sufficiently, the electric field will expand to the heavily doped N-type region before reaching the avalanche breakdown voltage of the device. With the increasing of the reverse bias voltage, avalanche breakdown finally occurs in the heavily doped N-type region. Since the PiN junction has a very thick barrier (lightly doped N region) and the distribution of the electric field in the i-type layer is substantially uniform and not easy to suffer from avalanche breakdown, the PiN junction can withstand a very high reverse voltage.

(2) Junction Termination Technology (a) Floating field ring technology is adopted. When the voltage applied to the main junction gradually increases, the depletion region of the main junction also gradually expands outwards; and before the voltage increases to the avalanche voltage of the main junction, the depletion regions of the two junctions already meet, functioning to increase the radius of curvature of the junction and improving the breakdown voltage. However, the action of improving the breakdown voltage by adding floating field rings will be weakened, and the field ring termination region occupies more areas, increasing the chip area and costs.

(b) Field plate technology is adopted. This technology increases the radius of curvature of the curved surface junction and suppresses the concentration of the surface electric field by changing the surface potential distribution, thereby improving the breakdown voltage of the device. However, an inherent defect of the field plate is that there is a peak electric field at the edge thereof which affects the breakdown voltage of the device.

SUMMARY

In view of the above defects in the prior art, an object of the present invention is to provide a semiconductor structure, a semiconductor assembly and a power semiconductor device to solve the problems in the prior art that the premature breakdown often happens at the interface of the PN junction and the breakdown voltage of the diode structure is small.

In order to realize the above object and other relevant objects, the present invention provides a semiconductor structure, comprising:

a P-type semiconductor material layer;

an N-type semiconductor material layer adjacent to the P-type semiconductor material layer; wherein the N-type semiconductor material layer and the P-type semiconductor material layer together form a PN junction; and a plurality of insulating material layers located outside the PN junction and distributed along the superposition direction of the P-type semiconductor material layer and the N-type semiconductor material layer, the relative dielectric constants of the adjacent insulating material layers are different.

As a preferred solution of the semiconductor structure in the present invention, the thickness of the P-type semiconductor material layer is far less than that of the N-type semiconductor material layer.

As a preferred solution of the semiconductor structure in the present invention, the plurality of insulating material layers is successively superposed as a superposition structure along the superposition direction of the P-type semiconductor material layer and the N-type semiconductor material layer, and the inner wall of the superposition structure contacts the outer wall of the PN junction.

As a preferred solution of the semiconductor structure in the present invention, the same insulating material layer is located outside the P-type semiconductor material layer, and the relative dielectric constant of the insulating material layer outside the P-type semiconductor material layer is greater than that of the P-type semiconductor material layer.

As a preferred solution of the semiconductor structure in the present invention, the outer wall of the PN junction contacts the same insulating material layer, the insulating material layer contacting the outer wall of the PN junction includes a first portion and a second portion, and the transverse thickness of the first portion is greater than that of the second portion; the first portion is located outside the P-type semiconductor material layer and a part of the N-type semiconductor material layer, and the second portion is located outside the N-type semiconductor material layer; and other insulating material layers are located outside the second portion and successively superposed along the superposition direction of the P-type semiconductor material layer and the N-type semiconductor material layer.

As a preferred solution of the semiconductor structure in the present invention, the relative dielectric constant of the insulating material layer outside the P-type semiconductor material layer is larger than that of the P-type semiconductor material layer.

As a preferred solution of the semiconductor structure in the present invention, some of the insulating material layers have the same relative dielectric constant.

As a preferred solution of the semiconductor structure in the present invention, the insulating material layers have relative dielectric constants different from each other.

As a preferred solution of the semiconductor structure in the present invention, the relative dielectric constants of the insulating material layers successively decrease in the direction from the P-type semiconductor material layer to the N-type semiconductor material layer.

As a preferred solution of the semiconductor structure in the present invention, the shape of the PN junction is a cylinder which includes two circular end surfaces and an arc sidewall located between the two circular end surfaces, and the insulating material layers are located on the arc sidewall.

As a preferred solution of the semiconductor structure in the present invention, the shape of the PN junction is a cube, and the insulating material layers are located on two opposite sidewalls of the PN junction.

As a preferred solution of the semiconductor structure in the present invention, the insulating material layers have 2 to 10 layers.

As a preferred solution of the semiconductor structure in the present invention, the relative dielectric constant of the insulating material layer ranges from 1 to 1000.

As a preferred solution of the semiconductor structure in the present invention, the material of the insulating material layer is $SiO_2$, $HfO_2$, $Al_2O_3$, $HaO_2$, $Si_3N_4$ or $La_2O_3$.

As a preferred solution of the semiconductor structure in the present invention, the semiconductor structure further comprises an anode and a cathode, wherein the anode is located on the surface of the P-type semiconductor material layer and the surface of the insulating material layer outside the P-type semiconductor material layer, and the cathode is located on the surface of the N-type semiconductor material layer and the surface of the insulating material layer outside the N-type semiconductor material layer.

The present invention also provides a semiconductor assembly, comprising a plurality of semiconductor structures of any one of the above solutions arranged in line to form a parallel structure.

The present invention also provides a power semiconductor device, comprising a plurality of semiconductor structures of any one of the above solutions.

As mentioned above, the semiconductor structure, the semiconductor assembly and the power semiconductor device in the present invention have the following beneficial effects:

1) significantly optimizing the distribution of an electric field during the off-state operation of a device, and greatly improving the breakdown voltage of the device;

2) avoiding the premature breakdown of the device caused by the concentration effect of the electric field at the edge of the junction, and preventing pre-breakdown of the device; and 3) avoiding the use of field rings and metal field plates, thus reducing chip area, reducing device cost, and improving device reliability.

DESCRIPTION OF REFERENCE NUMERALS

Figure 1:
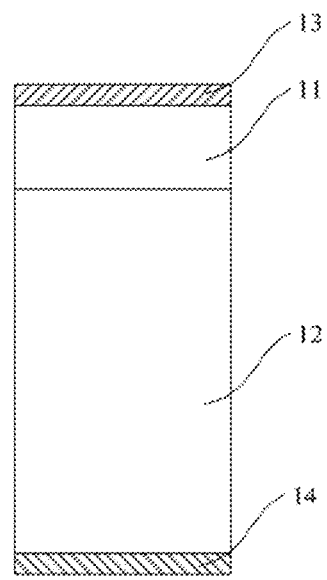
FIG. 1 shows a section view of a diode in the prior art.

11 P-type region
12 N-type region
13 Anode
14 Cathode
21 P-type semiconductor material layer
22 N-type semiconductor material layer
23 First insulating material layer
231 First portion
232 Second portion
24 Second insulating material layer
25 Third insulating material layer
26 Anode
27 Cathode
31 Source
32 Gate
33 Drain
34 N-type heavily doped source region
35 P-type base region
36 N-type drift region
37 N-type heavily doped substrate
38 Dielectric layer
41 Emitter
42 Gate
43 Collector
4 N-type heavily doped emitter region
45 P-type base region
46 P-type heavily doped base region
47 N-type drift region
48 P-type collector region
49 Dielectric layer

DETAILED DESCRIPTION OF THE PREFERRED EMBODIMENTS

The implementations of the present invention will be described by way of specific embodiments, and those skilled in the art may readily understand other advantages and effects of the present invention from the disclosure of the present invention. The present invention may also be implemented or applied with other different particular embodiments, and various details in the description may also be modified or varied without departing from the spirit of the present invention based on different viewpoints and applications.

Referring to FIGS. 2 to 17, it should be noted that the figures provided in this embodiment describe the basic concept of the present invention merely in an illustrative way. Although the figures merely show components related in the present invention and are not drawn according to the number, shape and size of components during actual implementation, the model, number and proportion of the components during actual implementation may be changed randomly, and the layout and model of the components may also be more complicated.

Embodiment I

Figure 2:
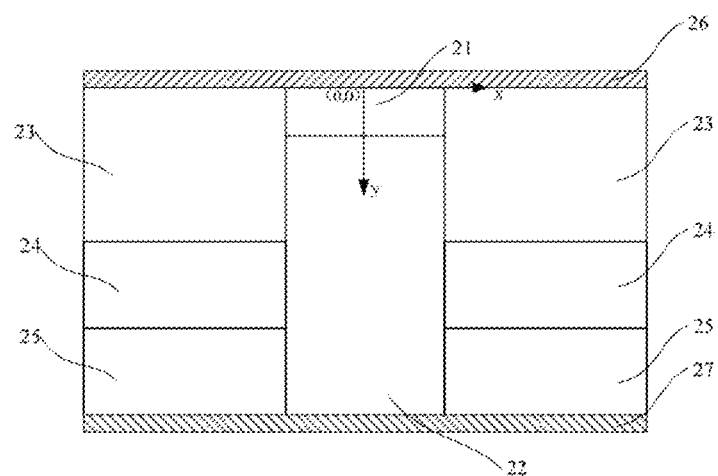
FIG. 2 shows a section view of a semiconductor structure provided according to embodiment I of the present invention.

Referring to FIG. 2, the present invention provides a semiconductor structure. The semiconductor structure includes: a P-type semiconductor material layer 21; an N-type semiconductor material layer 22 adjacent to the P-type semiconductor material layer 21, wherein the N-type semiconductor material layer 22 and the P-type semiconductor material layer 21 together form a PN junction; and a plurality of insulating material layers located outside the PN junction and distributed along the superposition direction of the P-type semiconductor material layer 21 and the N-type semiconductor material layer 22. The relative dielectric constants of the adjacent insulating material layers are different.

It should be noted that the P-type semiconductor material layer 21 may be located on the upper surface of the N-type semiconductor material layer 22 (as shown in FIG. 2), may also be located on the lower surface of the N-type semiconductor material layer 22 and may also be embedded in the N-type semiconductor material layer 22.

It should be further noted that the number of the insulating material layers may be set according to actual needs. Preferably, the number of the insulating material layers may be 2 to 10. FIG. 2 takes three insulating material layers as an example. That is, the plurality of insulating material layers include a first insulating material layer 23, a second insulating material layer 24 and a third insulating material layer 25.

As an example, the thickness of the P-type semiconductor material layer 21 is far less than that of the N-type semiconductor material layer 22 to ensure that the semiconductor structure has sufficiently high breakdown voltage. It should be noted that the thickness of the P-type semiconductor material layer 21 and the thickness of the N-type semiconductor material layer 22 are both the size along the y direction in FIG. 2.

As an example, the plurality of insulating material layers is successively superposed as a superposition structure along the superposition direction of the P-type semiconductor material layer 21 and the N-type semiconductor material layer 22. The inner wall of the superposition structure contacts the outer wall of the PN junction. That is, in FIG. 2, the first insulating layer 23, the second insulating layer 24 and the third insulating layer 25 are successively superposed along the superposition direction of the P-type semiconductor material layer 21 and the N-type semiconductor material layer 22. The first insulating layer 23, the second insulating layer 24 and the third insulating layer 25 contact the outer wall of the PN junction.

As an example, the same insulating material layer is located outside the P-type semiconductor material layer 21. The relative dielectric constant of the insulating material layer outside the P-type semiconductor material layer 21 is greater than that of the P-type semiconductor material layer 21. That is, as shown in FIG. 2, the first insulating material layer 23 is located outside the P-type semiconductor material layer 21, i.e., the thickness of the first insulating material layer 23 is greater than that of the P-type semiconductor material layer 21. The same insulating material layer located outside the P-type semiconductor material layer 21 can prevent the electric field at the contact interface of the P-type semiconductor material layer 21 and the N-type semiconductor material layer 22 from raising during the operation of the semiconductor structure, preventing premature breakdown. Since the electric field in an insulating material layer with a high relative dielectric constant during operation is relatively low, the relative dielectric constant of the insulating material layer located outside the P-type semiconductor material layer 21 is larger than that of the P-type semiconductor material layer 21, and the peak electric field at the PN junction interface can be lowered. Thus, concentration of the electric field at the PN junction interface can be avoided, and premature breakdown of the semiconductor structure can be prevented.

As an example, when there is a plurality of insulating material layers, the relative dielectric constants of non-adjacent insulating material layers may be the same or different. When the relative dielectric constants of non-adjacent insulating material layers are different, the relative dielectric constants of the insulating material layers may successively increase or decrease or alternately and irregularly change along the direction from the P-type semiconductor material layer 21 to the N-type semiconductor material layer 22. Preferably, in this embodiment, when the relative dielectric constants of the insulating material layers are different, the relative dielectric constants of the insulating material layers successively decrease along the direction from the P-type semiconductor material layer 21 to the N-type semiconductor material layer 22.

It should be noted that "along the direction from the P-type semiconductor material layer 21 to the N-type semiconductor material layer 22" refers to the direction of the current during the operation of the semiconductor structure when a positive voltage is applied on the P-type semiconductor material layer 21 and a negative voltage is applied on the N-type semiconductor material layer 22. The direction of the current during the operation of the semiconductor structure is the y direction from the P-type semiconductor material layer 21 to the N-type semiconductor material layer 22 in FIG. 2.

As an example, the shape of the PN junction formed by the P-type semiconductor material layer 21 and the N-type semiconductor material layer 22 may be set according to actual needs. That is, the shape of the PN junction may be a structure of cylinder, cube or other shape. When the shape of the PN junction is a cylinder, the cylinder includes two opposite circular end surfaces and an arc sidewall located between the two circular end surfaces. The superposition structure formed by the plurality of insulating material layers is located on the arc sidewall. The superposition structure formed by the plurality of insulating material layers may cover a part of the arc sidewall along the circumference of the cylinder and may also completely cover all of the arc sidewall. Preferably, in this embodiment, the superposition structure formed by the plurality of insulating material layers completely covers all of the arc sidewall. When the shape of the PN junction is a cube, the cube includes two opposite end surfaces and two pairs of opposite arc sidewalls located between the two end surfaces. The superposition structure formed by the plurality of insulating material layers is located on the two opposite sidewalls of the PN junction.

As an example, the relative dielectric constants of the insulating material layers may be selected according to actual needs. Preferably, the relative dielectric constants of the insulating material layers may be 1-1000. The insulating material layers may be material layers with low relative dielectric constants of 1-10 and may also be material layers with high relative dielectric constants of 10-1000. Some of the insulating material layers may be material layers with low relative dielectric constants of 1-10, and the remaining may also be material layers with high relative dielectric constants of 10-1000.

As an example, the materials of the insulating material layers may be selected according to actual needs. The materials of the insulating material layers may be $SiO_2$, $HfO_2$, $Al_2O_3$, $HaO_2$, $Si_3N_4$ or $La_2O_3$.

As an example, the semiconductor structure further comprises an anode 26 and a cathode 27. The anode 26 is located on the surface of the P-type semiconductor material layer 21 and the surface of the insulating material layer outside the P-type semiconductor material layer 21. The cathode 27 is located on the surface of the N-type semiconductor material layer 22 and the surface of the insulating material layer outside the N-type semiconductor material layer. That is, as shown in FIG. 2, the anode 26 is located on the surface of the P-type semiconductor material layer 21 and the surface of the first insulating material layer 23, and the cathode 27 is located on the surface of the N-type semiconductor material layer 22 and the surface of the third insulating material layer 25.

Figure 3:
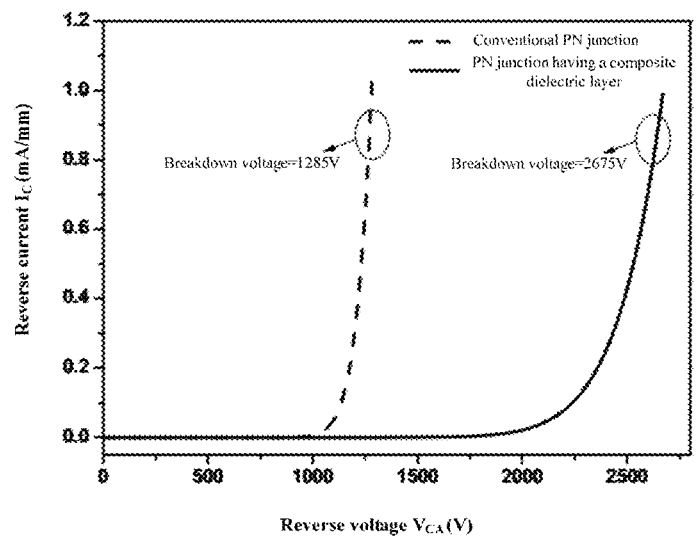
FIGS. 3 to 5 show current and voltage curves of semiconductor structures provided in different examples according to embodiment I of the present invention and the diode in FIG. 1.

FIG. 3 shows I-V curves of the semiconductor structure in FIG. 2 and the diode in FIG. 1 having the following parameters. The solid line is an I-V curve of the semiconductor structure in the present invention. The dashed line is an I-V curve of the diode in FIG. 1. The particular parameters of the diode in FIG. 1 are as follows: the material of the PN junction is GaN; the length of the PN joint is 2 μm; the thickness of the PN junction is 10 μm; the thickness of the P-type doped region 11 is 0.5 μm; the thickness of the N-type doped region 12 is 9.5 μm; the doping concentration of the P-type region 11 is $3\times10^{17}$ cm$^{-3}$; and the doping concentration of the N-type region 12 is $3\times10^{16}$ cm$^{-3}$. The particular parameters of the semiconductor structure according to the present invention in FIG. 3 are as follows: the material of the PN junction is GaN; the length of the PN junction is 2 μm; the thickness of the PN junction is 10 μm; the thickness of the P-type region 21 is 0.5 μm; the thickness of the N-type doped region 22 is 9.5 μm; the doping concentration of the P-type region 21 is $3\times10^{17}$ cm$^{-3}$; the doping concentration of the N-type region 22 is $3\times10^{16}$ cm$^{-3}$; the material of the first insulating material layer 23 is $Si_3N_4$; the relative dielectric constant of the first insulating material layer 23 is 7.5; the length of the first insulating material layer 23 is 3.5 μm; the thickness of the first insulating material layer 23 is 4 μm; the material of the second insulating material layer 24 is $SiO_2$; the relative dielectric constant of the second insulating material layer 24 is 3.9; the length of the second insulating material layer 24 is 3.5 μm; the thickness of the second insulating material layer 24 is 3 μm; the material of the third insulating material layer is fluoridized $SiO_2$; the relative dielectric constant of the third insulating material layer 25 is 2; the length of the third insulating material layer 25 is 3.5 μm; and the thickness of the third insulating material layer 25 is 3 μm. It should be noted that the length of each structure is the transverse dimension of each structure shown in FIG. 2, i.e., the dimension in x direction, and the thickness of each structure is the longitudinal dimension of each structure shown in FIG. 2, i.e., the dimension in y direction. It can be seen from FIG. 3 that the breakdown voltage of the semiconductor structure in the present invention is 2675V, significantly greater than the breakdown voltage 1285V of the PN junction of a conventional structure.

Figure 4:
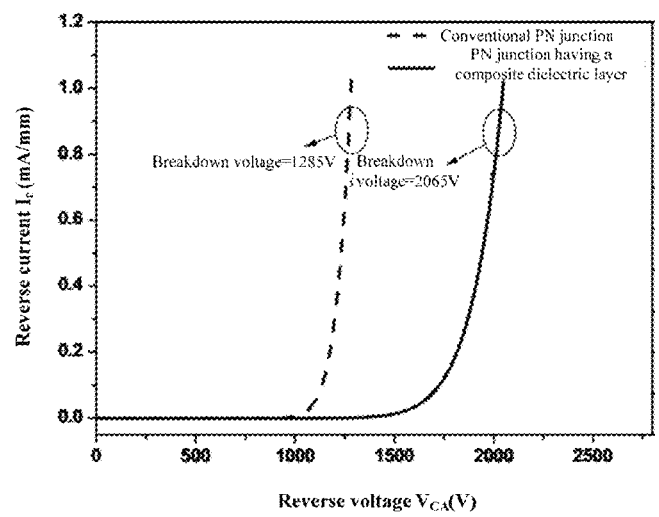

FIG. 4 shows I-V curves of the semiconductor structure in FIG. 2 and the diode in FIG. 1 having the following parameters. The solid line is a current and voltage curve of the semiconductor structure in the present invention. The dashed line is an I-V curve of the diode in FIG. 1. The particular parameters of the semiconductor structure according to the present invention in FIG. 4 are as follows: the material of the PN junction is GaN; the length of the PN junction is 2 μm; the thickness of the PN junction is 10 μm; the thickness of the P-type region 21 is 0.5 μm; the thickness of the N-type region 22 is 9.5 μm; the doping concentration of the P-type region 21 is $3\times10^{17}$ cm$^{-3}$; and the doping concentration of the N-type region 22 is $3\times10^{16}$ cm$^{-3}$; the material of the first insulating material layer 23 is Si$_3$N$_4$; the relative dielectric constant of the first insulating material layer 23 is 7.5; the length of the first insulating material layer 23 is 3.5 μm; and the thickness of the first insulating material layer 23 is 4 μm; the material of the second insulating material layer 24 is Al$_2$O$_3$; the relative dielectric constant of the second insulating material layer 24 is 9.3; the length of the second insulating material layer 24 is 3.5 μm; the thickness of the second insulating material layer 24 is 3 μm; the material of the third insulating material layer 25 is SiO$_2$; the relative dielectric constant of the third insulating material layer 25 is 3.9; the length of the third insulating material layer 25 is 3.5 μm; and the thickness of the third insulating material layer 25 is 3 μm. It should be noted that the length of each structure is the transverse dimension of each structure shown in FIG. 2, i.e., the dimension in x direction, and the thickness of each structure is the longitudinal dimension of each structure shown in FIG. 2, i.e., the dimension in y direction. It can be seen from FIG. 4 that the breakdown voltage of the semiconductor structure in the present invention is 2065V, significantly greater than the breakdown voltage 1285V of the PN junction of a conventional structure.

Figure 5:
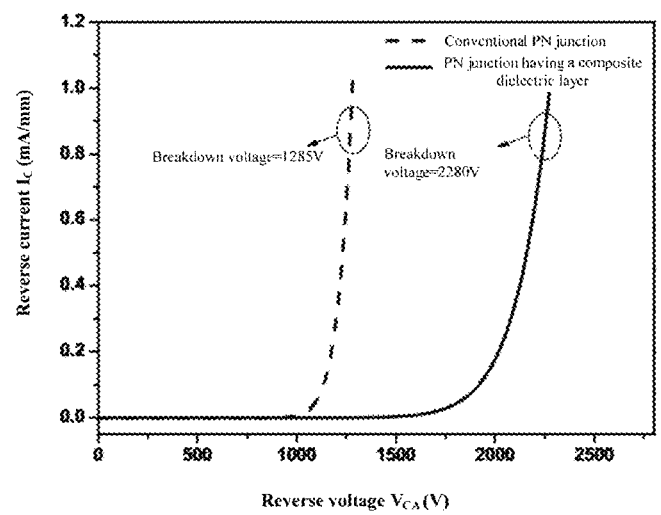

FIG. 5 shows -I-V curves of the semiconductor structure in FIG. 2 and the diode in FIG. 1 having the following parameters. The solid line is an I-V curve of the semiconductor structure in the present invention. The dashed line is a current and voltage curve of the diode in FIG. 1. The particular parameters of the semiconductor structure according to the present invention in FIG. 5 are as follows: the material of the PN junction is GaN; the length of the PN junction is 2 μm; the thickness of the PN junction is 10 μm; the thickness of the P-type region 21 is 0.5 μm; the thickness of the N-type region 22 is 9.5 μm; the doping concentration of the P-type region 21 is $3\times10^{17}$ cm$^{-3}$; and the doping concentration of the N-type region 22 is $3\times10^{16}$ cm$^{-3}$; the relative dielectric constant of the first insulating material layer 23 is 4; the length of the first insulating material layer 23 is 3.5 μm; the thickness of the first insulating material layer 23 is 4 μm; the relative dielectric constant of the second insulating material layer 24 is 2; the length of the second insulating material layer 24 is 3.5 μm; the thickness of the second insulating material layer 24 is 3 μm; the relative dielectric constant of the third insulating material layer 25 is 1; the length of the third insulating material layer 25 is 3.5 μm; and the thickness of the third insulating material layer 25 is 3 μm. It should be noted that the length of each structure is the transverse dimension of each structure shown in FIG. 2, i.e., the dimension in x direction, and the thickness of each structure is the longitudinal dimension of each structure shown in FIG. 2, i.e., the dimension in y direction. It can be seen from FIG. 5 that the breakdown voltage of the semiconductor structure in the present invention is 2280V, significantly greater than the breakdown voltage 1285V of the PN junction of a conventional structure.

Figure 6:
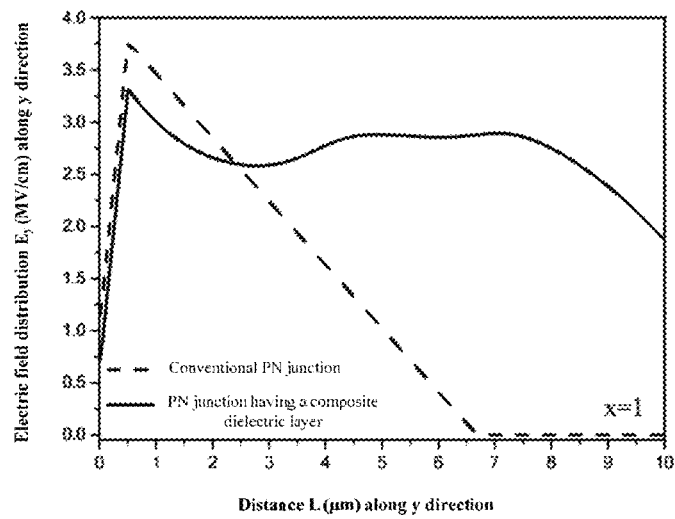
FIG. 6 shows a distribution view of a breakdown bias point electric field $E_y$ of the semiconductor structure provided according to embodiment I of the present invention and the diode in FIG. 1 along the direction of x=1, y.

FIG. 6 shows diagrams of electric field $E_y$ distribution at the breakdown voltage of the semiconductor structure in FIG. 2 and the diode in FIG. 1 having the following parameters along the direction of x=1, y (As shown in FIG. 2, the original of coordinates is at the center of the surface of the P-type semiconductor material layer 21 away from the N-type semiconductor material layer 22). FIG. 6 shows a distribution diagram of the breakdown bias point electric field $E_y$ of the semiconductor structure according to the present invention along the direction of x=1, y. The dashed line shows a distribution diagram of the breakdown bias point electric field $E_y$ of the diode in FIG. 1 along the direction of x=1, y. The particular parameters of the semiconductor structure according to the present invention in FIG. 6 are as follows: the material of the PN junction is GaN; the length of the PN junction is 2 μm; the thickness of the PN junction is 10 μm; the thickness of the P-type region 21 is 0.5 μm; the thickness of the N-type region 22 is 9.5 μm; the doping concentration of the P-type region 21 is $3\times10^{17}$ cm$^{-3}$; the doping concentration of the N-type region 22 is $3\times10^{16}$ cm$^{-3}$; the material of the first insulating material layer 23 is Si$_3$N$_4$; the relative dielectric constant of the first insulating material layer 23 is 7.5; the length of the first insulating material layer 23 is 3.5 μm; the thickness of the first insulating material layer 23 is 4 μm; the material of the second insulating material layer 24 is SiO$_2$; the relative dielectric constant of the second insulating material layer 24 is 3.9; the length of the second insulating material layer 24 is 3.5 μm; the thickness of the second insulating material layer 24 is 3 μm; the material of the third insulating material layer 25 is fluoridized SiO$_2$; the relative dielectric constant of the third insulating material layer 25 is 2; the length of the third insulating material layer 25 is 3.5 μm; and the thickness of the third insulating material layer 25 is 3 μm. It should be noted that the length of each structure is the transverse dimension of each structure shown in FIG. 2, i.e., the dimension in x direction, and the thickness of each structure is the longitudinal dimension of each structure shown in FIG. 2, i.e., the dimension in y direction. It can be seen from FIG. 6 that the semiconductor structure according to the present invention makes the distribution of the electric field inside the PN junction more uniform by providing an insulating material layer outside the PN junction, effectively improving the breakdown voltage of the device. The distribution curve of a conventional PN junction is a triangle, and the electric field away from the junction surface decreases gradually, lowering the breakdown voltage of the device.

In the present invention, a plurality of insulating material layers is provided outside the PN junction, and the relative dielectric constants of the plurality of insulating material layers are different. Since there are many large differences between insulating material layers with high relative dielectric constants and insulating material layers with low relative dielectric constants, the distribution of the electric field at the interface of the insulating material layers are discontinuous. The electric fields in insulating material layers with high relative dielectric constants are low. The electric fields in insulating material layers with low relative dielectric constants are high. The distribution of the electric field in the PN junction will be affected, such that the peak electric field at the junction interface of the PN junction is lowered, and the electric field away from the junction interface is increased, thus the distribution of the electric field in the PN junction is more uniform, significantly improving the breakdown voltage of the semiconductor structure. In addition, due to the effect of the low electric fields in the insulating layers with high relative dielectric constants, the electric field at the edge of the PN junction is significantly weakened, avoiding the electric field concentrating here, and thus preventing premature breakdown of the semiconductor structure.

Embodiment II

Figure 7:
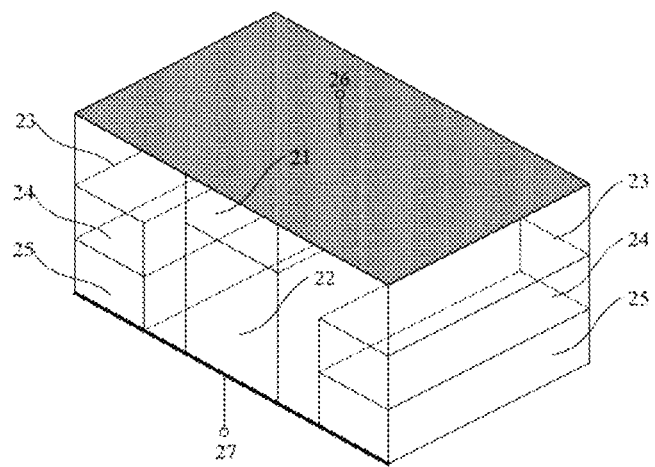
FIGS. 7 and 8 show perspective views of a semiconductor structure provided according to embodiment II of the present invention.
Figure 8:
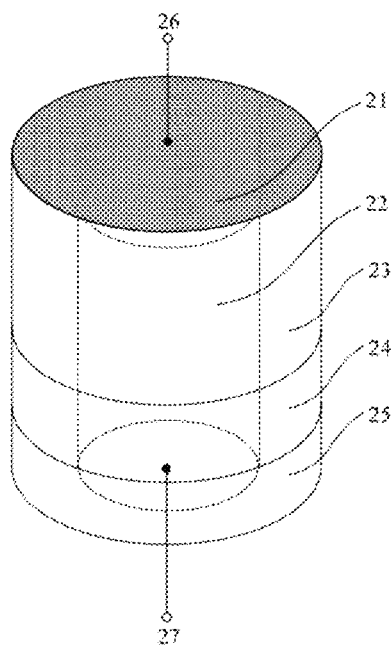
Figure 9:
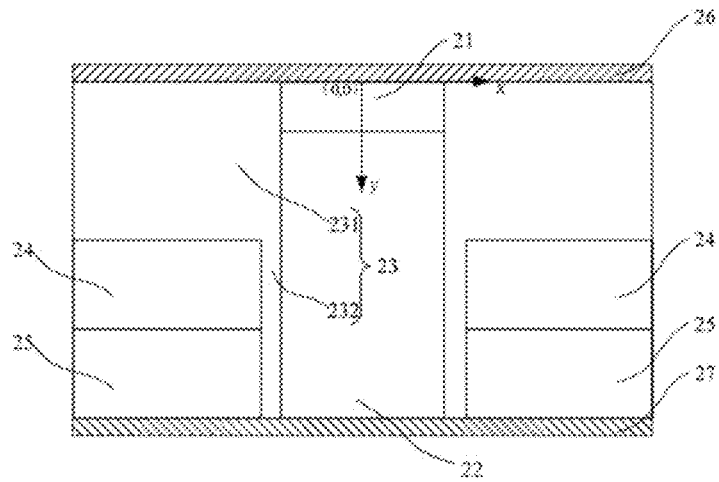
FIG. 9 shows a section view of a semiconductor structure provided according to embodiment II of the present invention.

The present invention also provided a semiconductor structure, as shown in FIGS. 7 to 9. FIG. 7 is a perspective view of the PN junction having a cube shape. FIG. 8 is a perspective view of the PN junction having a cylinder shape. FIG. 9 is a section view of FIG. 7. The structure of the semiconductor structure in this embodiment is substantially the same as that of the semiconductor in embodiment I. The difference there between lies in that: in the semiconductor structure of embodiment I, the insulating material layers are successively superposed outside the PN junction; that is, the inner sides of the insulating material layers contact the outer wall of the PN junction; however, in this embodiment, the outer wall of the PN junction merely contact the same insulating material layer; that is, as shown in FIGS. 7 to 9, the outer wall of the PN junction merely contacts the first insulating material layer 23, i. e., the first insulating material layer 23 extends from the top of the P-type semiconductor material layer 21 to the bottom of the N-type semiconductor material layer 22, and other insulating material layers (such as the second insulating material 24 and the third insulating material layer 25 in FIGS. 7 to 9) are all located outside the first insulating material layer 23, i.e., being isolated from the outer wall of the PN junction by means of the first insulating material layer 23; the first insulating material layer 23 contacting the outer wall of the PN junction includes a first portion 231 and a second portion 232; the transverse thickness of the first portion 231 is larger than that of the second portion 232; the first portion 231 is located outside the P-type semiconductor material layer 21 and outside a part of the N-type semiconductor material layer 22; the second portion 232 is located outside the N-type semiconductor material layer 22; other insulating material layers (such as the second insulating material 24 and the third insulating material layer 25 in FIGS. 7 to 9) are all located outside the second portion 232 and are successively superposed along the superposition direction of the P-type semiconductor material layer 21 and the N-type semiconductor material layer 22.

Other structures and features of the semiconductor structure in this embodiment are all the same as those of the semiconductor structure in embodiment I, which can be particularly made reference to embodiment I and will not be described here anymore.

In this embodiment, the PN junction contacts the same insulating material layer, which can modulate the electric field distribution of the PN junction, facilitate improving the breakdown property of the semiconductor structure. That is, the breakdown voltage of the semiconductor structure can be improved.

Figure 10:
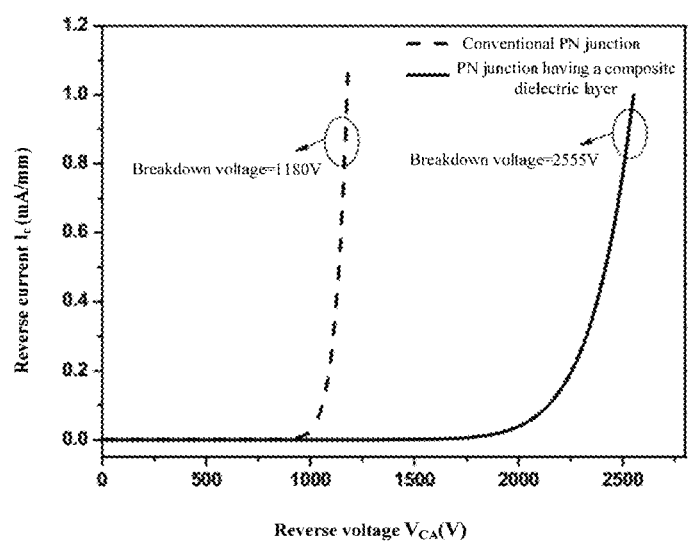
FIGS. 10 to 12 show voltage and current curves of semiconductor structures provided in different examples according to embodiment II of the present invention and the diode in FIG. 1.

FIG. 10 shows I-V curves of the semiconductor structure in FIG. 9 and the diode in FIG. 1 having the following parameters. The solid line is an I-V curve of the semiconductor structure in the present invention. The dashed line is an I-V curve of the diode. The particular parameters of the semiconductor structure according to the present invention in FIG. 10 are as follows: the material of the PN junction is GaN; the length of the PN junction is 2 μm; the thickness of the PN junction is 10 μm; the thickness of the P-type region 21 is 0.5 μm; the thickness of the N-type region 22 is 9.5 μm; the doping concentration of the P-type region 21 is $3\times10^{17}$ $cm^{-3}$; the doping concentration of the N-type region 22 is $3\times10^{16}$ $cm^{-3}$; the material of the first insulating material layer 23 is $Si_3N_4$; the relative dielectric constant of the first insulating material layer 23 is 7.5; the length of the first portion 231 of the first insulating material layer 23 is 3.5 μm; the length of the second portion 232 is 0.3 μm; the thickness of the first insulating material layer 23 is 10 μm; the thickness of the first portion 231 is 4 μm; and the thickness of the second portion 232 is 6 μm; the material of the second insulating material layer 24 is $SiO_2$; the relative dielectric constant of the second insulating material layer 24 is 3.9; the length of the second insulating material layer 24 is 3.2 μm; and the thickness of the second insulating material layer 24 is 3 μm; the material of the third insulating material layer 25 is fluoridized $SiO_2$; the relative dielectric constant of the third insulating material layer 25 is 2; the length of the third insulating material layer 25 is 3.2 μm; and the thickness of the third insulating material layer 25 is 3 μm. It should be noted that the length of each structure is the transverse dimension of each structure shown in FIG. 9, i.e., the dimension in x direction, and the thickness of each structure is the longitudinal dimension of each structure shown in FIG. 9, i.e., the dimension in y direction. It can be seen from FIG. 10 that the breakdown voltage of the semiconductor structure in the present invention is 2555V, significantly greater than the breakdown voltage 1285V of the PN junction of a conventional structure.

Figure 11:
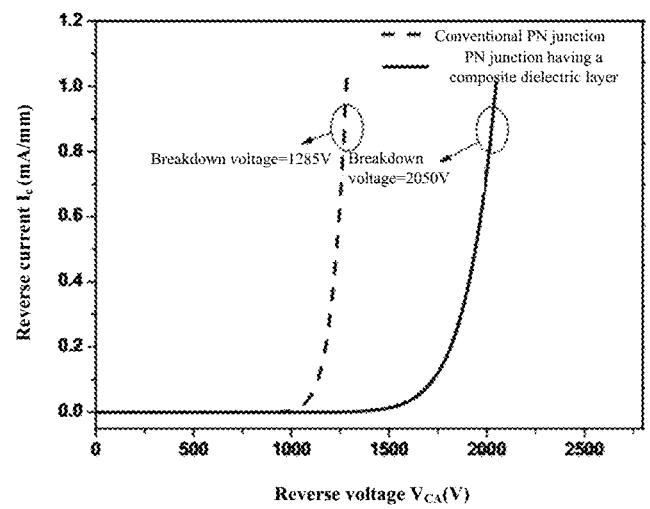

FIG. 11 shows I-V curves of the semiconductor structure in FIG. 9 and the diode in FIG. 1 having the following parameters. The solid line is an I-V curve of the semiconductor structure in the present invention. The dashed line is an I-V curve of the diode. The particular parameters of the semiconductor structure according to the present invention in FIG. 3 are as follows: the material of the PN junction is GaN; the length of the PN junction is 2 μm; the thickness of the PN junction is 10 μm; the thickness of the P-type region 21 is 0.5 μm; the thickness of the N-type region 22 is 9.5 μm; the doping concentration of the P-type region 21 is $3\times10^{17}$ $cm^{-3}$; the doping concentration of the N-type region 22 is $3\times10^{16}$ $cm^{-3}$; the material of the first insulating material layer 23 is $Si_3N_4$; the relative dielectric constant of the first insulating material layer 23 is 7.5; the length of the first portion 231 of the first insulating material layer 23 is 3.5 μm; the length of the second portion 232 is 0.3 μm; the thickness of the first insulating material layer 23 is 10 μm; the thickness of the first portion 231 is 4 μm; and the thickness of the second portion 232 is 6 μm; the material of the second insulating material layer 24 is $Al_2O_3$; the relative dielectric constant of the second insulating material layer 24 is 9.3; the length of the second insulating material layer 24 is 3.2 μm; the thickness of the third insulating material layer 25 is 3 μm; the material of the third insulating material layer 25 is $SiO_2$; the relative dielectric constant of the third insulating material layer 25 is 3.9; the length of the third insulating material layer 25 is 3.2 μm; and the thickness of the third insulating material layer 25 is 3 μm. It should be noted that the length of each structure is the transverse dimension of each structure shown in FIG. 9, i.e., the dimension in x direction, and the thickness of each structure is the longitudinal dimension of each structure shown in FIG. 9, i.e., the dimension in y direction. It can be seen from FIG. 11 that the breakdown voltage of the semiconductor structure in the present invention is 2050V, significantly greater than the breakdown voltage 1285V of the PN junction of a conventional structure.

Figure 12:
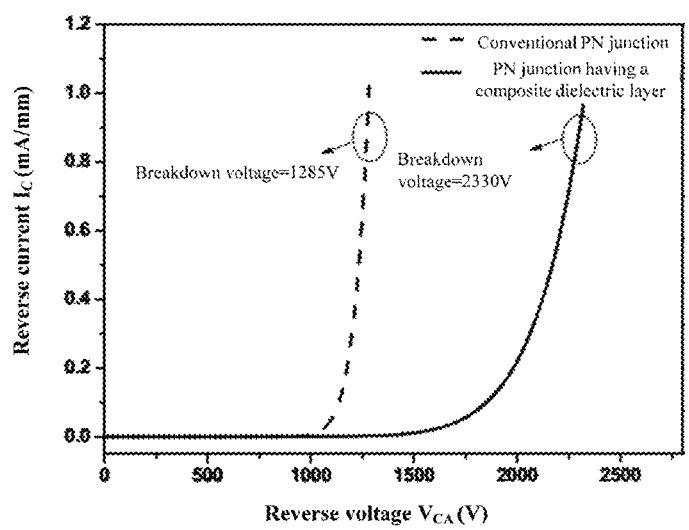

FIG. 12 shows I-V curves of the semiconductor structure in FIG. 9 and the diode in FIG. 1 having the following parameters. The solid line is an I-V curve of the semiconductor structure in the present invention. The dashed line is an I-V curve of the diode. The particular parameters of the semiconductor structure according to the present invention in FIG. 3 are as follows: the material of the PN junction is GaN; the length of the PN junction is 2 μm; the thickness of the PN junction is 10 μm; the thickness of the P-type region 21 is 0.5 μm; the thickness of the N-type region 22 is 9.5 μm; the doping concentration of the P-type region 21 is $3\times10^{17}$ cm$^{-3}$; the doping concentration of the N-type region 22 is 3×10$^{16}$ cm$^{-3}$; the relative dielectric constant of the first insulating material layer 23 is 1000; the length of the first portion 231 of the first insulating material layer 23 is 3.5 µm; the length of the second portion 232 is 0.3 µm; the thickness of the first insulating material layer 23 is 10 µm; the thickness of the first portion 231 is 4 µm; and the thickness of the second portion 232 is 6 µm; the relative dielectric constant of the second insulating material layer 24 is 800; the length of the second insulating material layer 24 is 3.5 µm; and the thickness of the third insulating material layer 25 is 3 µm; and the relative dielectric constant of the third insulating material layer 25 is 400; the length of the third insulating material layer 25 is 3.5 µm; and the thickness of the third insulating material layer 25 is 3 µm. It should be noted that the length of each structure is the transverse dimension of each structure shown in FIG. 9, i.e., the dimension in x direction, and the thickness of each structure is the longitudinal dimension of each structure shown in FIG. 9, i.e., the dimension in y direction. It can be seen from FIG. 12 that the breakdown voltage of the semiconductor structure in the present invention is 2330V, significantly greater than the breakdown voltage 1285V of the PN junction of a conventional structure.

Figure 13:
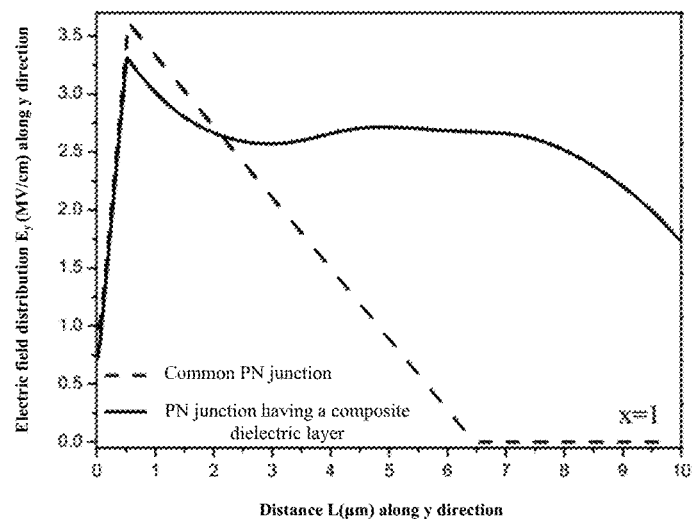
FIG. 13 shows a distribution view of a breakdown bias point electric field $E_y$ of the semiconductor structure provided according to embodiment II of the present invention and the diode in FIG. 1 along the direction of x=1, y.

FIG. 13 shows diagrams of the electric field E$_y$ distribution at the breakdown voltage of the semiconductor structure in FIG. 9 and the diode in FIG. 1 along the direction of x=1, y (As shown in FIG. 2, the original of coordinates is at the center of the surface of the P-type semiconductor material layer 21 away from the N-type semiconductor material layer 22) having the following parameters. FIG. 13 shows a diagram of the electric field E$_y$ distribution at the breakdown voltage of the semiconductor structure according to the present invention along the direction of x=1, y. The dashed line shows a diagram of the electric field E$_y$ distribution at the breakdown voltage of the diode in FIG. 1 along the direction of x=1, y. The particular parameters of the semiconductor structure according to the present invention in FIG. 13 are as follows: the material of the PN junction is GaN; the length of the PN junction is 2 µm; the thickness of the PN junction is 10 µm; the thickness of the P-type region 21 is 0.5 µm; the thickness of the N-type region 22 is 9.5 µm; the doping concentration of the P-type region 21 is 3×10$^{17}$ cm$^{-3}$; the doping concentration of the N-type region 22 is 3×10$^{16}$ cm$^{-3}$; the material of the first insulating material layer 23 is Si$_3$N$_4$; the relative dielectric constant of the first insulating material layer 23 is 7.5; the length of the first portion 231 of the first insulating material 23 is 3.5 µm; the length of the second portion 232 is 0.3 µm; the thickness of the first insulating material layer 23 is 10 µm; the thickness of the first portion 231 is 4 µm; and the thickness of the second portion 232 is 6 µm; the material of the second insulating material layer 24 is SiO$_2$; the relative dielectric constant of the second insulating material layer 24 is 3.9; the length of the second insulating material layer 24 is 3.2 µm; and the thickness of the second insulating material layer 24 is 3 µm; the material of the third insulating material layer 25 is fluoridized SiO$_2$; the relative dielectric constant of the third insulating material layer 25 is 2; the length of the third insulating material layer 25 is 3.2 µm, and the thickness of the third insulating material layer 25 is 3 µm. It should be noted that the length of each structure is the transverse dimension of each structure shown in FIG. 9, i.e., the dimension in x direction, and the thickness of each structure is the longitudinal dimension of each structure shown in FIG. 9, i.e., the dimension in y direction. It can be seen from FIG. 13 that the semiconductor structure according to the present invention makes the distribution of the electric field inside the PN junction more uniform by providing an insulating material layer outside the PN junction, effectively improving the breakdown voltage of the device. The distribution curve of a conventional PN junction is a triangle, and the electric field away from the junction surface decreases gradually, lowering the breakdown voltage of the device.

Embodiment III

Figure 14:
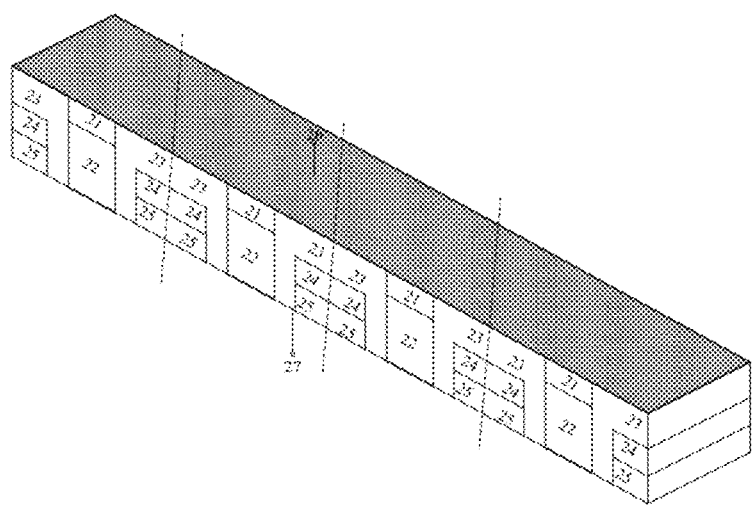
FIG. 14 shows a perspective view of a semiconductor assembly provided according to embodiment III of the present invention.
Figure 15:
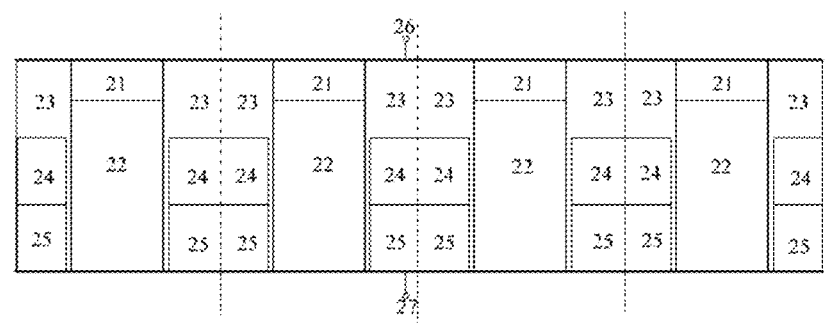
FIG. 15 shows a section view of a semiconductor assembly provided according to embodiment III of the present invention.

Referring to FIGS. 14 and 15, the present invention also provides a semiconductor assembly which includes a plurality of semiconductor structures in embodiment I or II. FIGS. 14 and 15 take the structure including a plurality of semiconductor structures in embodiment II as an example. The semiconductor assembly may also be a structure including a plurality of semiconductor structures in embodiment I. The plurality of semiconductor structures is arranged in line to form a parallel structure. That is, the outer walls of the adjacent insulating material layers of the semiconductor structure contact each other.

Embodiment IV

The present invention also provides a power semiconductor device, comprising the semiconductor structures in embodiment I or II. Hereinafter, some particular power semiconductor devices are taken as an example for description.

Figure 16:
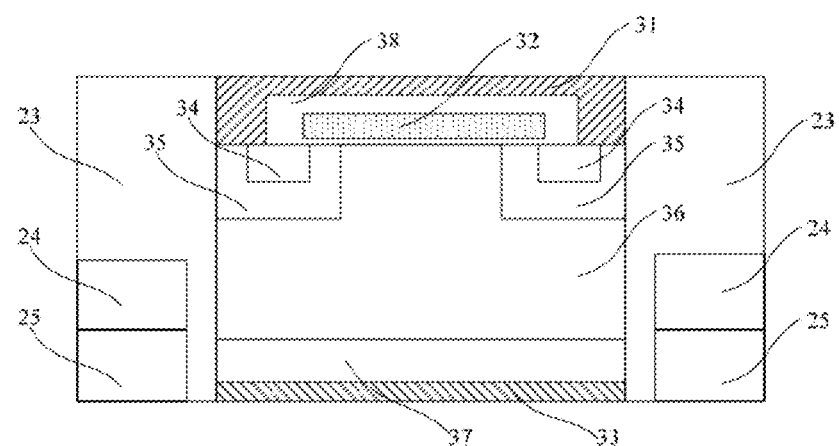
FIG. 16 shows a section view of a vertical diffusion field-effect transistor provided according to embodiment IV of the present invention.

Referring to FIG. 16, FIG. 16 shows a section view of a semiconductor structure in this embodiment when the semiconductor structure is applied to a vertical diffusion field-effect transistor (VDMOS). It can be seen from FIG. 16 that the vertical diffusion field-effect transistor includes: an N-type heavily doped substrate 37, an N-type drift region 36 located on the upper surface of the N-type heavily doped substrate 37, a drain 33 located on the lower surface of the N-type heavily doped substrate 37, a P-type base region 35 located in the N-type drift region 36, an N-type heavily doped source region 34 located in the P-type base region 35, a gate 32 located on the surface of the N-type drift region 36, a dielectric layer 38 covering the periphery of the gate 32, a source 31 covering the periphery of the dielectric layer 38 and contacting the N-type heavily doped source region 34, and a plurality of insulating material layers located outside the above structures. The P-type base region 35 is equivalent to the P-type semiconductor material layer 21 in embodiment I, and the N-type drift region 36 is equivalent to the N-type semiconductor material layer 22 in embodiment I.

Figure 17:
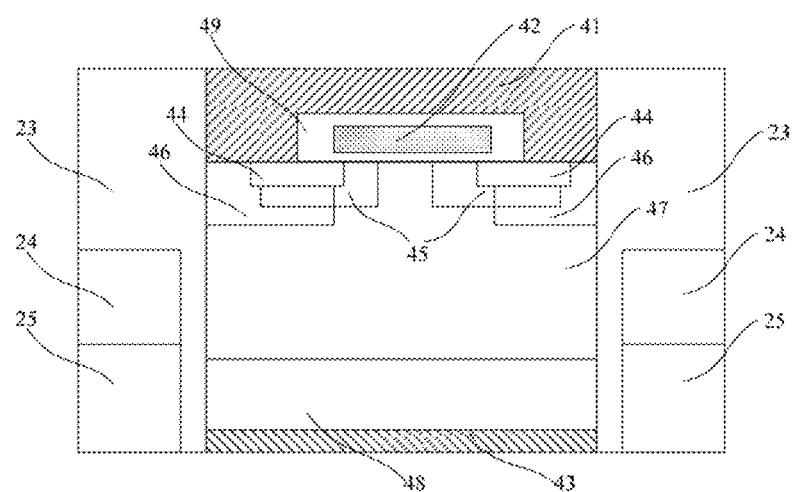
FIG. 17 shows a section view of an insulated-gate bipolar transistor provided according to embodiment IV of the present invention.

Referring to FIG. 17, FIG. 17 shows a section view of a semiconductor structure in this embodiment when the semiconductor structure is applied to an insulated gate bipolar transistor (IGBT). It can be seen from FIG. 17 that the insulated gate bipolar transistor includes: a P-type collector region 48, an N-type drift region 47 located on the upper surface of the P-type collector region 48, a collector 43 located on the lower surface of the P-type collector region 48, a P-type heavily doped base region 46 located in the N-type drift region 47, a P-type base region 45 located in the P-type heavily doped base region 46 and the N-type drift region 47, an N-type heavily doped emitter region 44 located in the P-type base region 45 and the P-type heavily doped base region 46, a gate 42 located on the surface of the N-type drift region 48, a dielectric layer 49 covering the periphery of the gate 42, an emitter 41 covering the periphery of the dielectric layer 49 and contacting the N-type heavily doped emitter region 44, and a plurality of insulating material layers located outside the above structure. The P-type base region 46 is equivalent to the P-type semiconductor material layer 21 in embodiment I, and the N-type drift region 47 is equivalent to the N-type semiconductor material layer 22 in embodiment I.

It should be noted that the semiconductor structure in embodiment I can also be applied to the above vertical diffusion field-effect transistor, i.e., the above insulated gate bipolar transistor.

In summary, the present invention provides a semiconductor structure, a semiconductor assembly and a power semiconductor device. The semiconductor structure includes: a P-type semiconductor material layer; an N-type semiconductor material layer adjacent to the P-type semiconductor material layer, wherein the N-type semiconductor material layer and the P-type semiconductor material layer together form a PN junction; and a plurality of insulating material layers located outside the PN junction and distributed along the superposition direction of the P-type semiconductor material layer and the N-type semiconductor material layer, wherein the relative dielectric constants of the adjacent insulating material layers are different. The semiconductor structure in the present invention significantly optimizes the distribution of an electric field during the off-state operation of a device, greatly improves the breakdown voltage of the device, avoids reduction of the breakdown voltage of the device caused by the concentration effect of the electric field at the edge of the junction, and prevents premature breakdown of the device. The present invention avoids the use of field rings and metal field plates, which reduces chip area, reduces device cost, and improves device reliability.

The above embodiments merely illustrate the principles and effects of the present invention in an exemplary manner rather than limiting the present invention. Any person skilled in the art may modify or vary the above embodiments without departing from the spirit and scope of the present invention. Therefore, any equivalent modifications or variations made by those skilled in the art without departing from the spirit and technical concept of the present invention shall be covered by the claims of the present invention.

What is claimed is:

1. A semiconductor structure, comprising:
a P-type semiconductor material layer;
an N-type semiconductor material layer adjacent to the P-type semiconductor material layer, the N-type semiconductor material layer and the P-type semiconductor material layer together form a PN junction;
a plurality of insulating material layers located outside the PN junction and distributed along a superposition direction of the P-type semiconductor material layer and the N-type semiconductor material layer, wherein relative dielectric constants of adjacent insulating material layers are different;
an outer wall of the PN junction contacts with a first insulating material layer of the plurality of insulating material layers, the first insulating material layer includes a first portion and a second portion, a transverse thickness of the first portion is greater than that of the second portion, the first portion is located outside the P-type semiconductor material layer and a part of the N-type semiconductor material layer, the second portion is located outside the N-type semiconductor material layer; and other insulating material layers of the plurality of insulating material layers are located outside the second portion and successively superposed along the superposition direction of the P-type semiconductor material layer and the N-type semiconductor material layer.

2. The semiconductor structure of claim 1, wherein a thickness of the P-type semiconductor material layer is less than that of the N-type semiconductor material layer.

3. The semiconductor structure of claim 1, wherein the plurality of insulating material layers is successively superposed as a superposition structure along the superposition direction of the P-type semiconductor material layer and the N-type semiconductor material layer, and an inner wall of the superposition structure contacts an outer wall of the PN junction.

4. The semiconductor structure of claim 3, wherein the plurality of insulating material layer located outside the P-type semiconductor material layer have a same material.

5. The semiconductor structure of claim 3, wherein some of the plurality of insulating material layers have a same relative dielectric constant.

6. The semiconductor structure of claim 3, wherein the plurality of insulating material layers have relative dielectric constants different from each other.

7. The semiconductor structure of claim 6, wherein relative dielectric constants of the plurality of insulating material layers successively decrease in a direction from the P-type semiconductor material layer to the N-type semiconductor material layer.

8. The semiconductor structure of claim 1, wherein relative dielectric constants of the plurality of insulating material layers outside the P-type semiconductor material layer are larger than that of the P-type semiconductor material layer.

9. The semiconductor structure of claim 1, wherein a shape of the PN junction is a cylinder which includes two circular end surfaces and an arc sidewall located between the two circular end surfaces, and the plurality of insulating material layers are located on the arc sidewall.

10. The semiconductor structure of claim 1, wherein a shape of the PN junction is a cube, and the plurality of insulating material layers are located on two opposite sidewalls of the PN junction.

11. The semiconductor structure of claim 1, wherein the plurality of insulating material layers have 2 to 10 layers.

12. The semiconductor structure of claim 1, wherein relative dielectric constants of the plurality of insulating material layers ranges from 1 to 1000.

13. The semiconductor structure of claim 1, wherein a material of the plurality of insulating material layers is $SiO_2$, $HfO_2$, $Al_2O_3$, $HaO_2$, $Si_3N_4$ or $La_2O_3$.

14. The semiconductor structure of claim 1, further comprising an anode and a cathode, wherein the anode is located on a surface of the P-type semiconductor material layer and a surface of the plurality of insulating material layers outside the P-type semiconductor material layer, and the cathode is located on a surface of the N-type semiconductor material layer and a surface of the plurality of insulating material layers outside the N-type semiconductor material layer.

15. A semiconductor assembly; comprising a plurality of semiconductor structures of claim 1 arranged in line to form a parallel structure.

16. A power semiconductor device comprising a semiconductor structure of claim 1.

* * * * *